US008445376B2

(12) United States Patent
Wang et al.

(10) Patent No.: US 8,445,376 B2
(45) Date of Patent: May 21, 2013

(54) POST-ETCHING TREATMENT PROCESS FOR COPPER INTERCONNECTING WIRES

(75) Inventors: Dongjiang Wang, Shanghai (CN); Junqing Zhou, Shanghai (CN); Haiyang Zhang, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/304,266

(22) Filed: Nov. 23, 2011

(65) Prior Publication Data

US 2012/0276737 A1  Nov. 1, 2012

(30) Foreign Application Priority Data

Apr. 27, 2011 (CN) .......................... 2011 1 0107556

(51) Int. Cl.
*H01L 21/4763* (2006.01)
*H01L 21/60* (2006.01)

(52) U.S. Cl.
USPC .................... 438/618; 438/637; 257/E21.507

(58) Field of Classification Search
USPC ......... 438/618, 620–629, 637–639, 642–645, 438/652–654, 666
See application file for complete search history.

(56) References Cited

U.S. PATENT DOCUMENTS

| 6,562,416 B2 * | 5/2003 | Ngo et al. ..................... 427/534 |
| 2003/0132510 A1 * | 7/2003 | Barth et al. .................... 257/637 |
| 2007/0082476 A1 * | 4/2007 | Kawahara et al. ............ 438/618 |
| 2010/0102451 A1 * | 4/2010 | Nishizawa .................... 257/773 |

* cited by examiner

*Primary Examiner* — Calvin Choi
(74) *Attorney, Agent, or Firm* — Anova Law Group, PLLC

(57) ABSTRACT

A method for post-etching treatment of copper interconnecting wires that are used to electrically couple an upper interconnecting layer with a lower interconnecting layer includes forming the lower interconnecting layer on a substrate, and forming the upper interconnecting layer on the lower interconnecting layer. The lower interconnecting layer includes a first dielectric layer, a plurality of wire trenches formed in the first dielectric layer and being filled with copper, and a first top barrier layer overlying the first dielectric layer and the wire trenches. The upper interconnecting layer includes a second dielectric layer on the top barrier layer, and a plurality of vias extending through the second dielectric layer and the top barrier layer and exposing the copper in the wire trenches. The method further includes treating the exposed copper using a plasma process comprising $NH_3$.

11 Claims, 6 Drawing Sheets

POST-ETCHING TREATMENT PROCESS FOR COPPER INTERCONNECTING WIRES

CROSS REFERENCE TO RELATED APPLICATIONS

The present application claims priority of Chinese Patent Application No. 201110107556.7, entitled "Post-etching Treatment Process for Copper Interconnecting Wires", filed on Apr. 27, 2011, the entire disclosure of which is incorporated herein by reference.

FIELD OF THE INVENTION

The present invention generally relates to the semiconductor manufacturing field, and more particularly, to a post-etching treatment process for copper interconnecting wires.

BACKGROUND OF THE INVENTION

Copper has higher conductivity and better electromigration resistance property than aluminum. Copper is thus widely used as interconnecting wires in Very Large Scale Integration (VLSI) devices. However, copper tends to diffuse in a dielectric layer and causes leakage current and a breakdown of the dielectric layer. Therefore, a barrier layer is disposed between copper interconnecting wires and the dielectric layer to prevent the diffusion of copper. With the development of VLSI devices, especially with the scaling down of high-performance logic devices, the diffusion of copper into the dielectric layer that is disposed between adjacent interconnecting wires can cause a breakdown of the dielectric layer.

According to the breakdown characteristics of the dielectric layer, the breakdown can be divided into two types: an intrinsic breakdown and a Time Dependent Dielectric Breakdown (TDDB). When a voltage is applied to two adjacent copper interconnecting wires that are separated by a dielectric layer, an electric field is generated in the dielectric layer disposed between the two adjacent wires. If the generated electric field has a strength equal to or greater than a critical field strength of the dielectric layer in a copper interconnecting structure, a current will flow in the dielectric layer, and an intrinsic breakdown may occur. However, when the electric field strength is less than an intrinsic breakdown field strength, the intrinsic breakdown does not immediately occur, but the time dependent dielectric breakdown will be induced over a certain period of time due to a weakness in the isolation in the dielectric layer over time under the bias condition.

Furthermore, the many causes for the time dependent dielectric breakdown are described as follows. As the integration degree of chips increases, interconnecting wires become so thin that current density in the interconnecting wires increases exponentially. Under the influence of the high current density, metal ions in the interconnecting wires migrate in a direction opposite to a direction of the electron motion. This phenomenon is called electromigration. In the electromigration phenomenon, migration of the metal ions may induce pileup in a local area so that hillocks are formed in a metal layer of the interconnecting wires. The electromigration may also induce voids in the interconnect wires because of mass loss, thereby degrading the interconnect performance and causing opens to the interconnecting wires.

Therefore, preventing the loss of copper ions in the metal layer in copper interconnecting wires can improve the time dependent dielectric breakdown. In a process for forming the copper interconnecting wires, the copper interconnecting wires are exposed in an environment including an etching gas having an oxidizing ability so that copper atoms on the surface of the copper interconnecting wires are oxidized to CuO. To solve the problem mentioned above, a method for deoxygenizing copper atoms using $N_2$ or $H_2$ is disclosed in a paper entitled "Avoiding Cu Hillocks during the Plasma Process" published in Journal of The Electrochemical Society co-authored by Tsung-Kuei and Kang. The method for deoxygenizing copper atoms by using $N_2$ or $H_2$ is based on the principle: plasma is ionized to be ions or atoms in high voltage environment, then the ions and atoms can deoxygenize Cu from CuO in a deoxidization reaction on the surface of the copper interconnecting wires. However, the copper atoms deoxygenized are still in an unstable state so that the efficacy of improving the time dependent dielectric breakdown by inhibiting the loss of copper ions is not evident. Furthermore, in a plasma etching process in which a trench is formed in an upper interconnecting layer, the plasma may react with a second dielectric layer on the upper interconnecting layer, in which defect appears on a surface of the second dielectric layer. Although the second dielectric layer generally includes low dielectric constant materials, the defect will make a dielectric constant of the second dielectric layer become greater in a subsequent process of forming the copper interconnecting wires.

In view of analysis above, there is a need to provide a post-etching treatment process for the copper interconnecting wire, which can prevent the loss of the copper ions in the metal layer in the copper interconnecting wires, thereby avoiding the time dependent dielectric breakdown and reducing the defect on the surface of the second dielectric layer.

SUMMARY OF THE INVENTION

Embodiments of the present invention provide a post-etching treatment process for copper interconnecting wires, which can prevent the loss of copper ions in a metal layer in the copper interconnecting wires, thereby avoiding a time dependent dielectric breakdown and reducing defects on a surface of a second dielectric layer in the copper interconnecting wires.

In an embodiment, the post-etching treatment process for copper interconnecting wires that are used to connect an upper interconnecting layer with a lower interconnecting layer includes forming the lower interconnecting layer and forming the upper interconnect layer overlying the lower interconnecting layer. In an embodiment, the lower interconnecting layer is formed by depositing a first dielectric layer on a substrate, forming multiple wire trenches in the first dielectric layer, depositing copper in the wire trenches, and depositing a top barrier layer overlying the first dielectric layer and the wire trenches. The upper interconnecting layer is formed by depositing a second dielectric layer on the top barrier layer and forming multiple vias that extend through the second dielectric layer and the top barrier layer to expose the copper that has been deposited in the wire trenches. The method further includes treating the exposed copper using a plasma process including $NH_3$.

Optionally, in the post-etching treatment process for copper interconnecting wires, the plasma process including $NH_3$ is performed in a plasma processing chamber that is controlled by a processing control system to provide a pressure ranging from 100 to 300 mTorr, a power ranging from 100 to 300 W, a flow rate ranging from 50 to 200 sccm, and a processing time duration ranging from 10 to 60 seconds.

Optionally, in the post-etching treatment process for copper interconnecting wires, the first dielectric layer includes a first etch stop layer, a first low-k material layer and a first top layer which are successively formed on a substrate.

Optionally, in the post-etching treatment process for copper interconnecting wires, the second dielectric layer includes a second low-k material layer and a second top layer which are successively formed on the top barrier layer.

Optionally, in the post-etching treatment process for copper interconnecting wires, a dielectric constant of the first low-k material layer is less than a dielectric constant of silicon dioxide.

Optionally, in the post-etching treatment process for copper interconnecting wires, a dielectric constant of the second low-k material layer is less than the dielectric constant of silicon dioxide.

Optionally, in the post-etching treatment process for copper interconnecting wires, an etching process for forming the first wire trenches includes: coating photoresist on the first top layer, exposing and developing the photoresist; etching the first top layer and the first low-k material layer successively until the first etch stop layer is exposed; and removing the residual photoresist on the first top layer.

Optionally, in the post-etching treatment process for copper interconnecting wires, etching gas used to etch the first top layer and the first low-k material layer includes at least one gas selected from the group consisted of $C_4F_6$, $C_4F_8$, $O_2$, $N_2$, Ar, $CO_2$, $CF_4$, $CF_3H$, $CF_2H_2$, and $CFH_3$. In an embodiment, the gas used to remove the residual photoresist on the first top layer comprises at least one gas selected from the group consisted of $O_2$, $CO_2$, $H_2$, and $CH_4$.

Optionally, in the post-etching treatment process for copper interconnecting wires, an etching process for removing the second dielectric layer and the top barrier layer includes coating a photoresist on the second top layer, exposing and developing the photoresist; etching the second top layer and the second low-k material layer until the top barrier layer is exposed; removing the residual photoresist on the second top layer; and etching the top barrier layer.

Optionally, in the post-etching treatment process for copper interconnecting wires, etching gas used to etch the second top layer and the second low-k material layer comprises at least one gas selected from the group consisted of $C_4F_6$, $C_4F_8$, $O_2$, $N_2$, Ar, $CO_2$, $CF_4$, $CF_3H$, $CF_2H_2$, and $CFH_3$. In an embodiment, the gas used to remove the residual photoresist on the second top layer comprises at least one gas selected from the group consisted of $O_2$, $CO_2$, $H_2$, and $CH_4$. In an embodiment, the etching gas used to etch the top barrier layer comprises at least one kind of gas selected from the group consisted of $C_4F_6$, $C_4F_8$, $O_2$, $N_2$, Ar, $CO_2$, $CF_4$, $CF_3H$, $CF_2H_2$, and $CFH_3$.

Compared with the prior art, the present invention has the following advantages. When the plasma process including NH3 is used to process copper interconnecting wires, ions, active atoms or radicals achieved by ionizing NH3 can prevent the loss of copper ions in the metal layer in the copper interconnecting wires, thereby avoiding the time dependent dielectric breakdown and reducing the defects on the surface of the second dielectric layer in the copper interconnecting wires.

DETAILED DESCRIPTION OF THE INVENTION

The present invention discloses the post-etching treatment of copper interconnecting wires using a plasma process containing $NH_3$. Ions, active atoms or radicals achieved by ionizing $NH_3$ can prevent the loss of copper ions in a metal layer in the copper interconnecting wires, thereby avoiding a time dependent dielectric breakdown and reducing defects on a surface of a second dielectric layer in the copper interconnecting wires.

The above-mentioned and other benefits, features and advantages of the present invention will become clearer through the description in conjunction with the accompanying drawings. It should be noted that the drawings are provided for illustrative purposes only and, as such, they are not necessarily drawn to scale.

Although the present invention is disclosed hereinafter with reference to preferred embodiments, it also can be implemented in other different embodiments and those skilled in the art may modify and vary the embodiments without departing from the spirit and scope of the present invention. Therefore, the present invention should not be limited by the embodiments disclosed herein.

Figure 1:
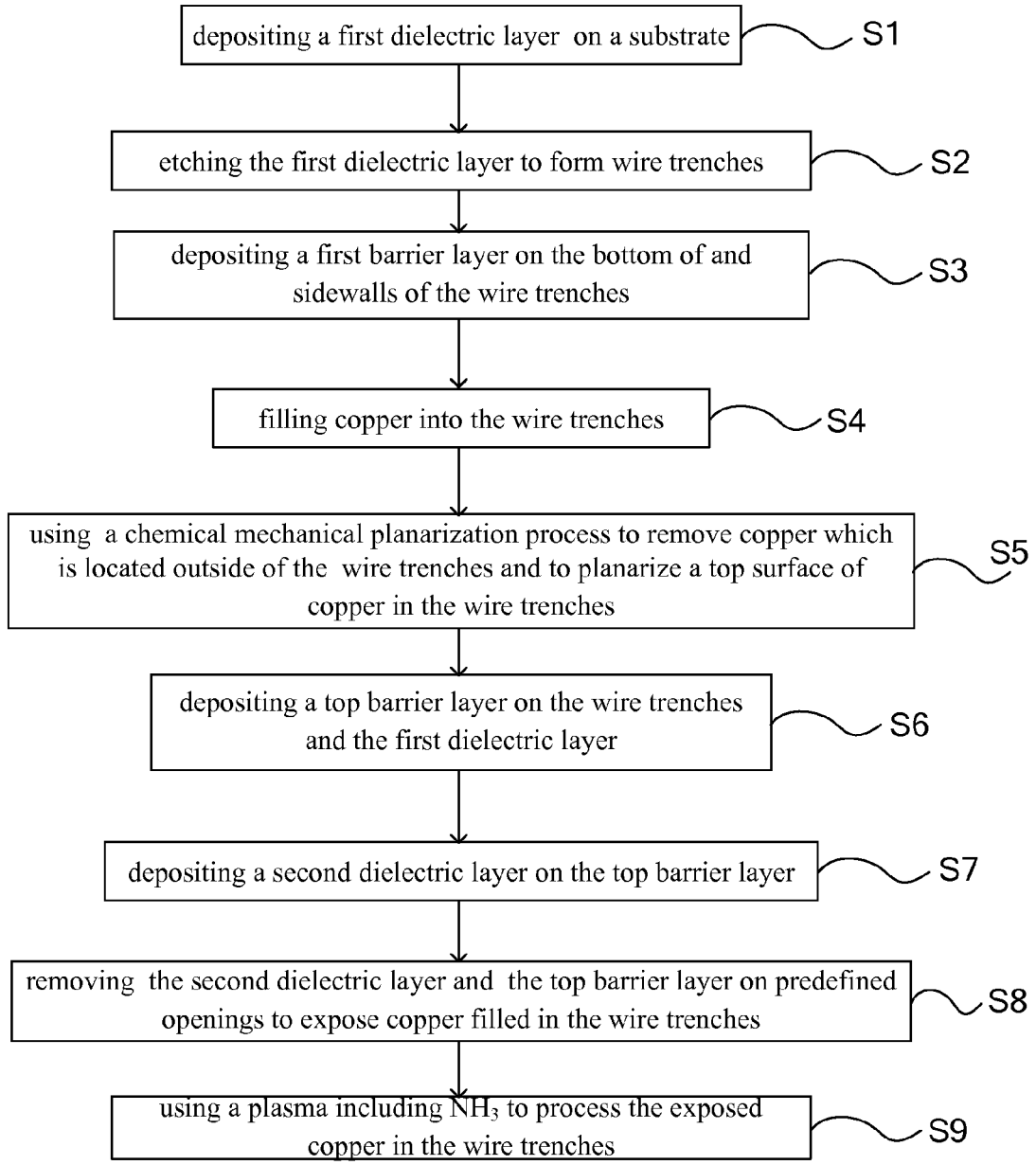
FIG. 1 is a flowchart illustrating a post-etching treatment process for copper interconnecting wires according to an embodiment of the present invention.
Figure 2:
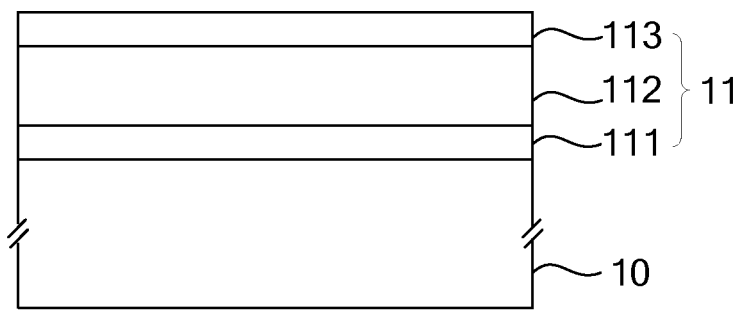
FIG. 2 through FIG. 9 are schematic cross-sectional views of intermediate structures illustrating a process for manufacturing the copper interconnecting wires used in the post-etching treatment process according to an embodiment of the present invention.

Referring to FIG. 1 and FIG. 2, in step S1, a first dielectric layer 11 is deposited on a substrate 10. The substrate may include silicon, germanium silicon or silicon on insulator. In addition, a component layer, which includes components such as transistors and diodes, is formed on substrate 10 (not shown).

In an embodiment, the first dielectric layer 11 is an insulating layer stack including a first etch stop layer 111, a first low-k material layer 112, and a first top layer 113 that are subsequently formed on the substrate.

The first dielectric layer 112 is used to prevent copper from diffusing into the substrate in subsequent processing steps. Copper has a deep impurity level in silicon and has a large diffusion constant so that it can exist as an impurity donor that forms a donor level or as an impurity acceptor that forms an acceptor level. Therefore, to avoid a leakage current caused by the diffusion of copper ions, a dielectric constant (k) of the first low-k material layer 112 needs to be lower than a dielectric constant (k=3.9) of silicon dioxide. In an embodiment, the first low-k material layer 112 may include a material selected from the group consisting of hydrogen silsesquioxane (HSQ, k=2.8~3.0), methylsilsesquioxame (MSQ, k=2.5~2.7) with functional radicals of Si—$CH_3$, hybrid organic siloxane polymer (HOSP, k=2.5) which includes HSQ and MSQ, porous film of SiOCH (k=2.3~2.7), porous silicate (k<2) and porous film of SiOCH (k=1.9).

The first etch stop layer 111 is adopted as a stop layer in an etching process to etch the first low-k material layer 112, which ensures the etching process for etching the first low-k material layer 112 stopped appropriately and a good etching uniformity between the center and edge of the first low-k material layer 112 obtained. In an embodiment, the first etch stop layer 111 may include silicon nitride or silicon oxynitride.

In the etching process for etching the first low-k material layer 112, the first top layer 113 is adopted to protect a part of the first dielectric layer 112 which is not etched. In an embodiment, the first top layer 113 includes silicon nitride.

Figure 3:
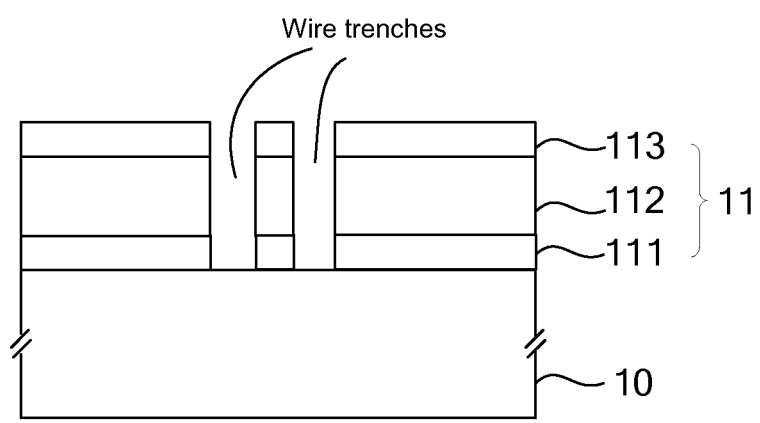

Referring to FIG. 3, step S2 is performed on the first dielectric layer, in which the dielectric layer 11 is etched to form a plurality of first wire trenches.

The etching process for etching the first dielectric layer 11 for forming the first wire trenches includes depositing a photoresist on the first top layer 113, exposing and developing the photoresist, wherein a spin on method can be used to coat the photo resist in an example embodiment; and etching the first top layer 113 and the first low-k material layer 112 until the first etch stop layer 111 is exposed, wherein etching gas used to etch the first top layer 113 and the first low-k material layer 112 includes at least one gas selected from the group consisted of $C_4F_6$, $C_4F_8$, $O_2$, $N_2$, Ar, $CO_2$, $CF_4$, $CF_3H$, $CF_2H_2$, and $CFH_3$ and the gas used to remove the residual photoresist on the first top layer 113 includes at least one gas selected from the group consisted of $O_2$, $CO_2$, $H_2$, and $CH_4$.

Figure 4:
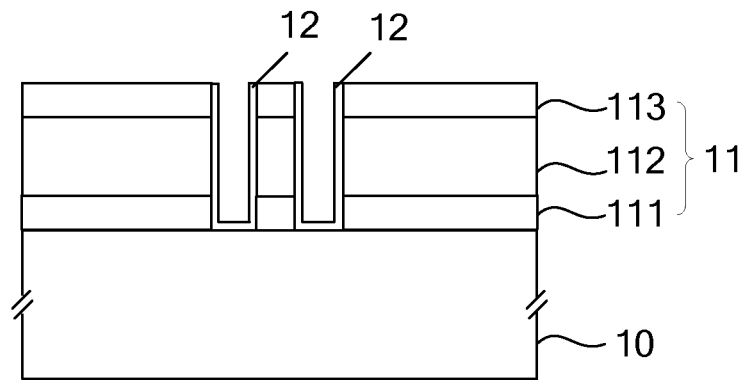

Thereafter, referring to FIG. 4, in step S3, a first barrier layer 12 is deposited on the bottom and sidewalls of the first wire trenches. In an embodiment, the first barrier layer 12 may include Ta or TaN, which can prevent the copper ions from diffusing from the bottom and the sidewalls of the first wire trenches into the first dielectric layer 11.

In an embodiment, a process adopted to form the first barrier layers may be a physical vapor deposition (PVD) process, a chemical vapor deposition (CVP) process, a pulsed laser deposition (PLP) process, an electron beam evaporation process or other metallic-film plating processes, which are well known by those skilled in the art and will not be described in detail herein for the sake of brevity.

Figure 5:
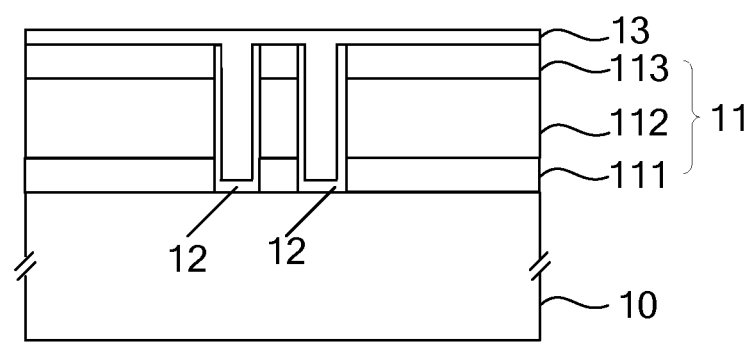

Thereafter, referring to FIG. 5, in step S4, a copper material 13 is filled in the wire trenches. In an embodiment, a method to fill the copper material includes depositing a seed layer overlying the wire trenches and then filling copper into the wire trenches using an electroplating process that well known by those skilled in the art and will not be described in detail herein.

Figure 6:
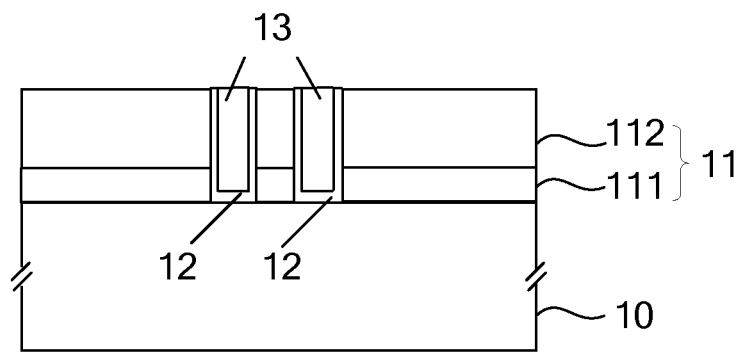

Thereafter, referring to FIG. 6, in step S5, a chemical mechanical polishing process is adopted to remove a portion of the copper material that is disposed outside of the wire trenches and on the first top layer 113 and to planarize a top surface of copper in the wire trenches. The chemical mechanical polishing process includes mechanical friction caused by small particles and chemical cleaning provided for friction materials.

Figure 7:
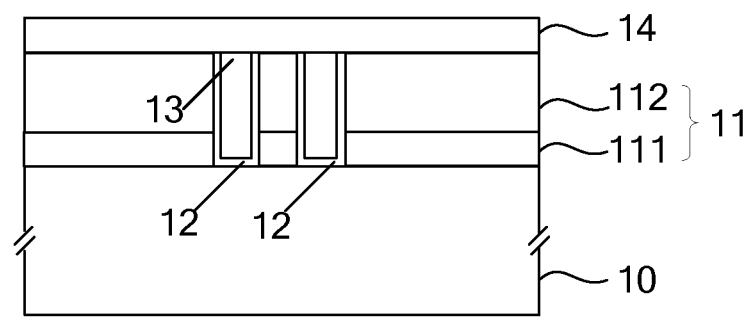

Thereafter, referring to FIG. 7, in step S6, after planarizing the wire trenches, a top barrier layer 14 is deposited to cover the wire trenches and the first dielectric layer 11. A deposition process and materials adopted for forming the top barrier layer 14 are the same as those adopted for forming the first barrier layer 12 in step S3. The top barrier layer 14 can prevent the copper ions from diffusing from the surface of the copper interconnecting wires into the first dielectric layer between adjacent copper interconnecting wires. The top barrier layer 14 can also be used as an etch stop layer in a process for forming an upper interconnecting layer. A lower interconnecting layer is thus formed after performing step 6.

Figure 8:
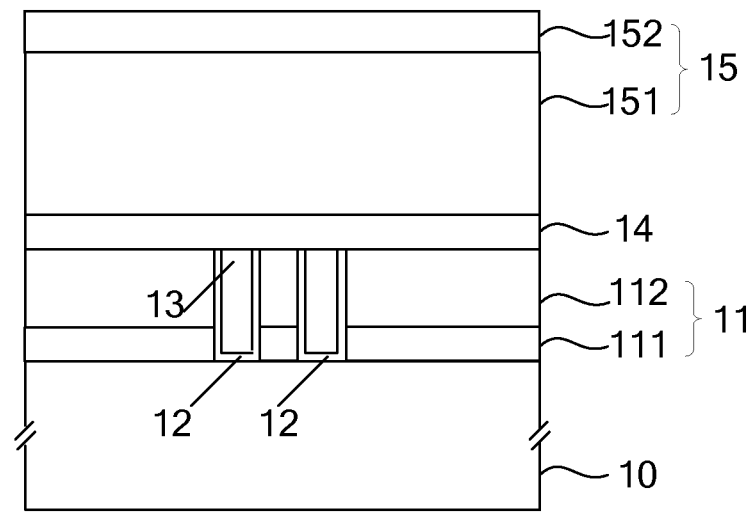

Thereafter, referring to FIG. 8, in step S7, a second dielectric layer 15 is deposited on the top barrier layer 14. The second dielectric layer 15 includes a second low-k material layer 151 and a second top layer 152 which are formed on the top barrier layer 14 successively. In addition, a dielectric constant of the second low-k material layer 151 is less than the dielectric constant of silicon dioxide, materials used to form the second low-k material layer 151 are the same as those used to form the first low-k material layer 112, and materials used to form the second top layer 152 are the same as those used to form the first top layer 113.

Figure 9:
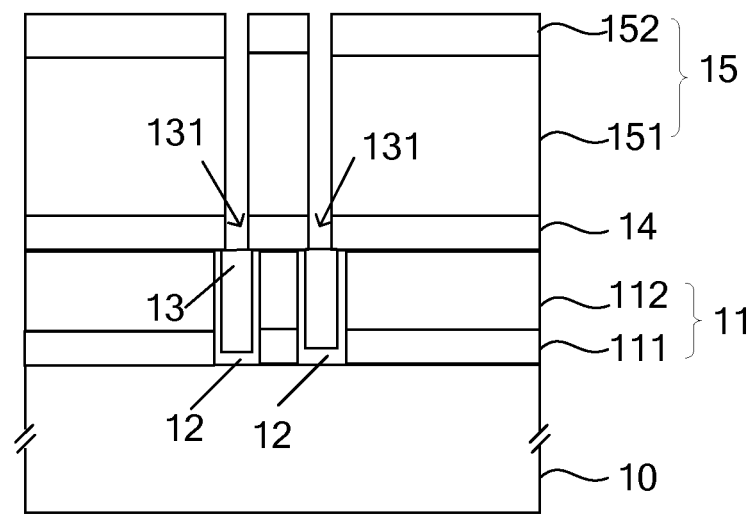
Figure 10:
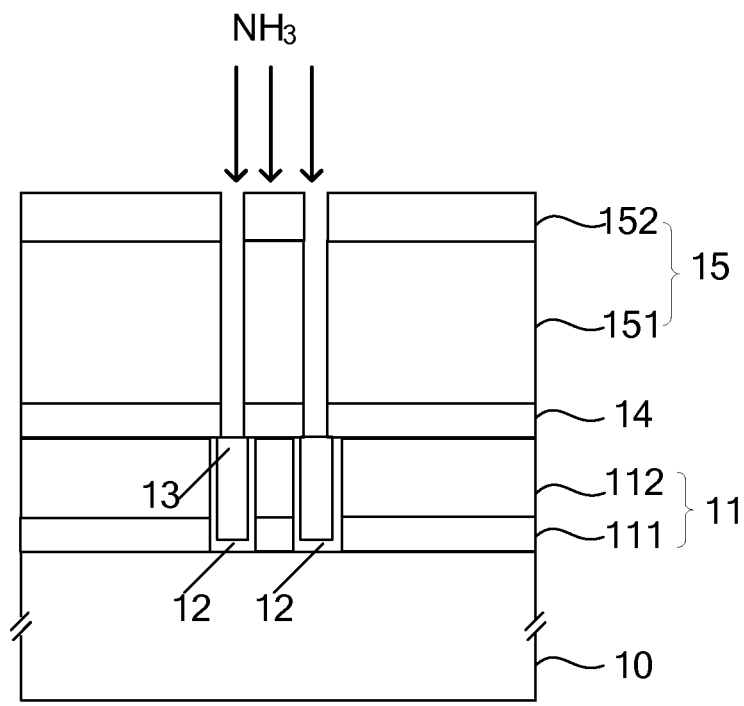
FIG. 10 is a schematic cross-sectional view illustrating a process step of post-etching copper interconnecting wires using a plasma process including $NH_3$ in an embodiment of the present invention.
Figure 11:
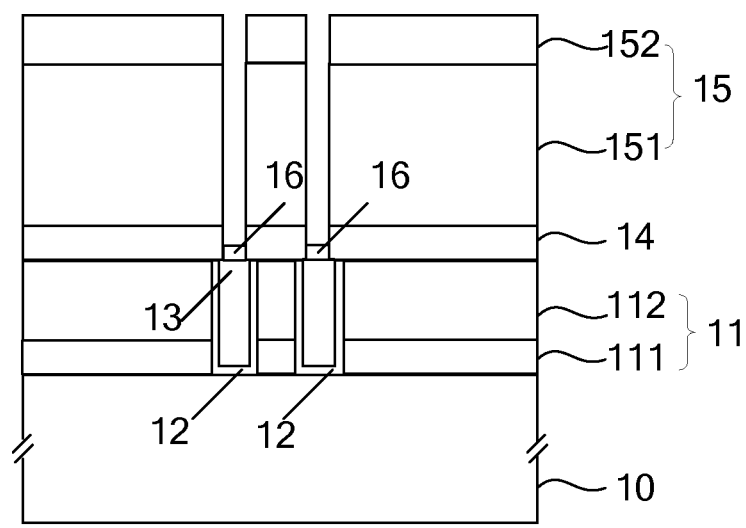
FIG. 11 is a schematic cross-sectional view showing a result of the copper interconnecting wires after being processed using the plasma process including $NH_3$ in an embodiment of the present invention.

Thereafter, referring to FIG. 9, in step S8, a portion of the second dielectric layer 15 and the top barrier layer 14 is removed at predefined openings until the copper material 13 is exposed to form vias 131 which are used for forming copper interconnecting wires. Vias 131 will be filled with copper in subsequent steps to form copper interconnecting wires. A process for removing the second dielectric layer 15 and the top barrier layer 14 at the predefined opening includes: coating photoresist on the second top layer 152, exposing and developing the photoresist, in order to forming two vias on the predefined locations; and etching the second top layer 152 and the second low-k material layer 151 successively until the top barrier layer 14 is exposed. In addition, etching gas used to etch the second top layer 152 and the second low-k material layer 151 includes at least one kind of gas selected from $C_4F_6$, $C_4F_8$, $O_2$, $N_2$, Ar, $CO_2$, $CF_4$, $CF_3H$, $CF_2H_2$, and $CFH_3$, gas used to remove the residual photo resist on the second top layer 152 includes at least one kind of gas selected from $O_2$, $CO_2$, $H_2$, and $CH_4$, and etching gas used to etch the top barrier layer 14 includes at least one kind of gas selected from $C_4F_6$, $C_4F_8$, $O_2$, $N_2$, Ar, $CO_2$, $CF_4$, $CF_3H$, $CF_2H_2$, and $CFH_3$.

It should be noted that, the second top layer 152, the second low-k material layer 151 and the top barrier layer 14 can not be etched in a single etching process, because the second low-k material layer 151 generally includes a greater thickness, so that the time spent on forming the predefined vias is longer and the photoresist coated on the second top layer 152 needs to be thicker. In addition, the residual photoresist after etching the second top layer 152 and the second low-k material layer 151 also needs to be removed before etching the top barrier layer 14. The copper material is then exposed after performing step S8.

Thereafter, in step S9, the exposed copper material is processed with a plasma gas which includes $NH_3$.

The copper interconnecting wires formed in steps from S1 through S8 are disposed into a plasma processing chamber that is controlled by a process system to process the exposed surface of the copper interconnecting wires. In a first example embodiment, the plasma processing chamber contains a gas including $NH_3$, the chamber is operating at a pressure ranging from about 100 to about 300 mTorr, a power ranging from 100 to 300 W, a flow rate ranging from 50 to 200 sccm, and a processing time ranging from 10 to 60 seconds. In a second example embodiment, the processing chamber contains a plasma gas including $N_2$, and the chamber is operating at a 300 mTorr pressure, a power of 300 W, a flow rate of 200 sccm, and a processing time of 30 seconds. In a third example embodiment, the plasma processing chamber contain a plasma gas including $H_2$, the chamber is operating at a pressure of about 300 mTorr, a power of about 300 W, a flow rate of about 200 sccm, and a processing time of about 30 seconds.

By using an X-ray photoelectron spectroscopy (XPS) to test the processing results of the copper interconnecting wires in the three example embodiments, the characteristic peak value of Cu in a 2p state indicates that all of the three example embodiments can deoxygenize Cu from CuO. However, in the first example embodiment, the characteristic peak value of N in a 2s state indicates a CuN layer 16 is formed on the surface of the copper interconnecting wires, but in the second and third example embodiments, there is no CuN layer. Therefore, there are two important features in processing the copper interconnecting wires by using the first kind of plasma gas. The first feature is the CuN layer can be used as a protective film to prevent the copper ions from diffusing from the bottom of the surface of the copper interconnecting wires into the dielectric layer between adjacent copper interconnecting wires, thereby improving the time dependent dielectric breakdown. The second feature is that, because the second low-k material layer 151 includes porous SiOCH film, there are four covalent bonds around silicon in the porous SiOCH film, and in the step S9, ions, active atoms or radicals achieved by ionizing NH3 are more than those achieved by ionizing $N_2$ or $H_2$, the ions, active atoms or radicals are jointed with silicon and its radical by the covalent bonds so that the defect on the second low-k material layer caused by etching the first wire trenches decreases and the increasing amount of the dielectric constant of the porous SiOCH film decreases.

It should be noted that, the flow rate of $NH_3$ in step S9 should not be too high or too low. If the flow rate is too low, a reaction between $NH_3$ and the copper material will not be complete. On the other hand, if the flow rate is too high, in the reaction between $NH_3$ and the copper material, most of the $NH_3$ will be wasted.

After numerous experiments and research, the inventors discovered that, when the second low-k material layer 151 included porous film of SiOCH and the plasma process parameters were arranged with a pressure ranging from 100 to 300 mTorr, a power ranging from 100 to 300 W, a flow rate ranging from 50 to 200 sccm, and a processing time ranging 10 to 60 seconds, the time of TDDB of the copper interconnecting wires was 30% longer than the time of TDDB of the copper interconnecting wires which are processed in the second and the third example embodiments, and the increasing amount of the dielectric constant of the porous SiOCH film was less than 0.2.

Although the present invention has been disclosed in preferred embodiments, many variations and modifications are possible therein and will be apparent to those skilled in the art after reading the foregoing description of embodiments. Accordingly, the scope of the present invention shall be defined in the appended claims.

What is claimed is:

1. A process for post-etching treatment of copper interconnecting wires used to electrically couple an upper interconnecting layer with a lower interconnecting layer, the process comprising:
    forming the lower interconnecting layer, wherein the forming of the lower interconnecting layer comprises:
        forming a first dielectric layer on a substrate, wherein the first dielectric layer comprises a first top layer formed on a first low-k material layer that is formed on a first etch stop layer;
        forming a plurality of wire trenches in the first dielectric layer by etching the first top layer and the first low-k material layer of the first dielectric layer using an etching as selected from the group consisting of $CO_2$, $CF_3H$, $CF_2H_2$, and $CFH_3$ until the first etch stop layer of the first dielectric layer is exposed;
        depositing copper in the plurality of wire trenches; and
        depositing a top barrier layer overlying the first dielectric layer and the plurality of wire trenches,
    forming the upper interconnecting layer, wherein the forming of the upper interconnecting layer comprises:
        forming a second dielectric layer on the top barrier layer;
        forming a plurality of vias extending through the second dielectric layer and the top barrier layer to expose the copper being deposited in the plurality of wire trenches in the first dielectric layer; and
        treating the exposed copper through the plurality of vias formed through the second dielectric layer and the top barrier layer using a plasma process comprising $NH_3$.

2. The process according to claim 1, wherein the plasma process is performed in a plasma processing chamber being controlled by a process control system that provides a pressure ranging from 100 to 300 mTorr, a power ranging from 100 to 300 W, a flow rate ranging from 50 to 200 sccm, and a processing time duration ranging from 10 to 60 seconds.

3. The process according to claim 1, wherein the second dielectric layer comprises: a second low-k material layer overlying the top barrier layer; and a second top layer overlying the second low-k material layer.

4. The process according to claim 1, wherein the first low-k material layer comprises a dielectric constant having a value lower than a dielectric constant of silicon dioxide.

5. The process according to claim 3, wherein the second low-k material layer comprises a dielectric constant having a value lower than a dielectric constant of silicon dioxide.

6. The process according to claim 1, wherein forming the plurality of wire trenches comprises:
    coating a photoresist layer on the first top layer;
    exposing and developing the photoresist layer;
    subsequently etching the first top layer and the first low-k material layer until the first etch stop layer is exposed; and
    removing the photoresist layer.

7. The process according to claim 6, wherein removing the photoresist layer comprises a gas selected from the group of $O_2$, $CO_2$, $H_2$, and $CH_4$.

8. The process according to claim 3, wherein forming the plurality of vias comprises:
    coating a photoresist layer on the second top layer;
    exposing and developing the photoresist layer;
    subsequently etching the second top layer and the second low-k material layer until the top barrier layer is exposed;
    removing the photoresist layer; and
    etching the top barrier layer.

9. The process according to claim 8, wherein the subsequently etching the second top layer and the second low-k material layer comprises an etching gas selected from the group consisted of $C_4F_6$, $C_4F_8$, $O_2$, $N_2$, Ar, $CO_2$, $CF_4$, $CF_3H$, $CF_2H_2$, and $CFH_3$.

10. The process according to claim 8, wherein removing the photoresist layer on the second top layer comprises a gas selected from the group consisted of $O_2$, $CO_2$, $H_2$ and $CH_4$.

11. The process according to claim 8, wherein etching the top barrier layer comprises an etching gas selected from the group consisting of $C_4F_6$, $C_4F_8$, $O_2$, $N_2$, Ar, $CO_2$, $CF_4$, $CF_3H$, $CF_2H_2$, and $CFH_3$.

* * * * *